US012772461B2

(12) United States Patent
Jin et al.

(10) Patent No.: US 12,772,461 B2
(45) Date of Patent: Oct. 20, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Hyeongwoo Jin, Suwon-si (KR); Myoungchul Eum, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 516 days.

(21) Appl. No.: 18/205,721

(22) Filed: Jun. 5, 2023

(65) Prior Publication Data

US 2024/0145417 A1 May 2, 2024

(30) Foreign Application Priority Data

Oct. 12, 2022 (KR) ........................ 10-2022-0130793

(51) Int. Cl.
*H10B 80/00* (2026.01)
*H10W 72/00* (2026.01)
(Continued)

(52) U.S. Cl.
CPC ............ *H10B 80/00* (2023.02); *H10W 90/00* (2026.01); *H10W 72/01204* (2026.01); *H10W 72/01215* (2026.01); *H10W 72/01304* (2026.01); *H10W 72/01351* (2026.01); *H10W 72/019* (2026.01); *H10W 72/01904* (2026.01); *H10W 72/0198* (2026.01); *H10W 72/07207* (2026.01); *H10W 72/07232* (2026.01); *H10W 72/07254* (2026.01); *H10W 72/07307* (2026.01); *H10W 72/07332* (2026.01); *H10W 72/07354* (2026.01); *H10W 72/247* (2026.01); *H10W 72/252* (2026.01); *H10W 72/287* (2026.01); *H10W 72/325* (2026.01); *H10W 72/347* (2026.01); *H10W 72/353* (2026.01); *H10W 72/354* (2026.01); *H10W 72/877* (2026.01); *H10W 72/923* (2026.01); *H10W 72/932* (2026.01); *H10W 72/9415* (2026.01); *H10W 72/942* (2026.01);
(Continued)

(58) Field of Classification Search
CPC ........................................................ H01L 24/10
See application file for complete search history.

(56) References Cited

U.S. PATENT DOCUMENTS 6,803,176 B2 10/2004 Choi et al.
7,279,362 B2 10/2007 Li et al.
(Continued)

FOREIGN PATENT DOCUMENTS

KR 10-0421034 B1 3/2004
KR 2013-0007124 A 1/2013

*Primary Examiner* — William A Harriston
(74) *Attorney, Agent, or Firm* — Muir Patent Law, PLLC

(57) ABSTRACT

A semiconductor package and a method of fabricating the same. The semiconductor package includes a lower structure including a first lower conductive pad disposed on an upper surface thereof, a first semiconductor chip disposed on the lower structure, the first semiconductor chip including a first chip conductive pad disposed on a lower surface thereof, a solder ball connecting the first lower conductive pad and the first chip conductive pad, a photosensitive insulating layer filling a space between the lower structure and the first semiconductor chip, and a first organic insulating layer covering a side surface of the first chip conductive pad.

18 Claims, 14 Drawing Sheets

(51) Int. Cl.
*H10W 72/20* (2026.01)
*H10W 72/30* (2026.01)
*H10W 72/90* (2026.01)
*H10W 74/15* (2026.01)
*H10W 90/00* (2026.01)
*H10W 99/00* (2026.01)

(52) U.S. Cl.
CPC ........ *H10W 72/944* (2026.01); *H10W 72/981* (2026.01); *H10W 72/987* (2026.01); *H10W 74/15* (2026.01); *H10W 90/722* (2026.01); *H10W 90/724* (2026.01); *H10W 90/732* (2026.01); *H10W 90/734* (2026.01); *H10W 99/00* (2026.01)

(56) References Cited

U.S. PATENT DOCUMENTS

| | | | | |
|---|---|---|---|---|
| 8,642,390 | B2 | 2/2014 | Wang et al. | |
| 9,589,920 | B2 | 3/2017 | Hurwitz et al. | |
| 9,761,477 | B2 | 9/2017 | Chang et al. | |
| 2007/0267745 | A1 | 11/2007 | Chao et al. | |
| 2009/0233436 | A1 | 9/2009 | Kim et al. | |
| 2013/0000978 | A1* | 1/2013 | Choi | H05K 3/3442<br>174/94 R |

* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0130793, filed on Oct. 12, 2022, in the Korean Intellectual Property Office, the entire contents of which are hereby incorporated by reference.

BACKGROUND

1. Field

Embodiments relate to a semiconductor package and a method of fabricating the same.

2. Description of the Related Art

An integrated circuit chip may be provided with a semiconductor package so as to be suitably applied to an electronic product. In a general semiconductor package, an integrated circuit chip is mounted on a printed circuit board (PCB) and is electrically connected to the PCB through bonding wirings or bumps. Various research for improving the reliability and durability of the semiconductor package has been conducted along with the development of the electronic industry.

SUMMARY

Embodiments are directed to a semiconductor package including a lower structure including a first lower conductive pad disposed on an upper surface thereof, a first semiconductor chip disposed on the lower structure, the first semiconductor chip including a first chip conductive pad disposed on a lower surface thereof, a solder ball connecting the first lower conductive pad and the first chip conductive pad, a photosensitive insulating layer filling a space between the lower structure and the first semiconductor chip, and a first organic insulating layer covering a side surface of the first chip conductive pad.

A semiconductor package according to some embodiments may include a first semiconductor chip including a first chip conductive pad disposed on an upper surface thereof, at least one second semiconductor chip disposed on the first semiconductor chip, the second semiconductor chip including a second chip conductive pad disposed on a lower surface thereof, a solder ball connecting the first chip conductive pad and the second chip conductive pad, a photosensitive insulating layer filling a space between the first semiconductor chip and the second semiconductor chip, and a first organic insulating layer covering a side surface of the second chip conductive pad.

A semiconductor package according to some embodiments may include a first semiconductor chip including a first chip upper conductive pad disposed on an upper surface thereof, a plurality of second semiconductor chips stacked on the first semiconductor chip, each of the second semiconductor chips including a second chip upper conductive pad disposed on an upper surface thereof and a second chip lower conductive pad disposed on a lower surface thereof, a first solder ball connecting the second chip lower conductive pad of a lowermost one of the second semiconductor chips and the first chip upper conductive pad, a second solder ball disposed between the second semiconductor chips, a first photosensitive insulating layer filling a space between the lowermost one of the second semiconductor chips and the first semiconductor chip, a second photosensitive insulating layer filling a space between the second semiconductor chips, a first organic insulating layer covering a side surface of the first chip upper conductive pad, a second organic insulating layer covering a side surface of the second chip lower conductive pad, and a third organic insulating layer covering a side surface of the second chip upper conductive pad.

A method of fabricating a semiconductor package according to some embodiments may include preparing a wafer structure including a device region and a scribe lane region, the wafer structure including first chip conductive pads in the device region, bonding solder balls to the first chip conductive pads, forming first organic insulating layers on surfaces of the solder balls, respectively, forming a photosensitive insulating layer covering the wafer structure and the first organic insulating layers, performing exposure and developing processes on the photosensitive insulating layer to form holes exposing the first organic insulating layers in the photosensitive insulating layer, preparing a substrate including first substrate conductive pads, and placing the wafer structure on the substrate and performing a thermal compression process to bond the solder balls on the first substrate conductive pads.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, to provide an explanation in more detail, embodiments will be described with reference to the accompanying drawings.

Figure 1:
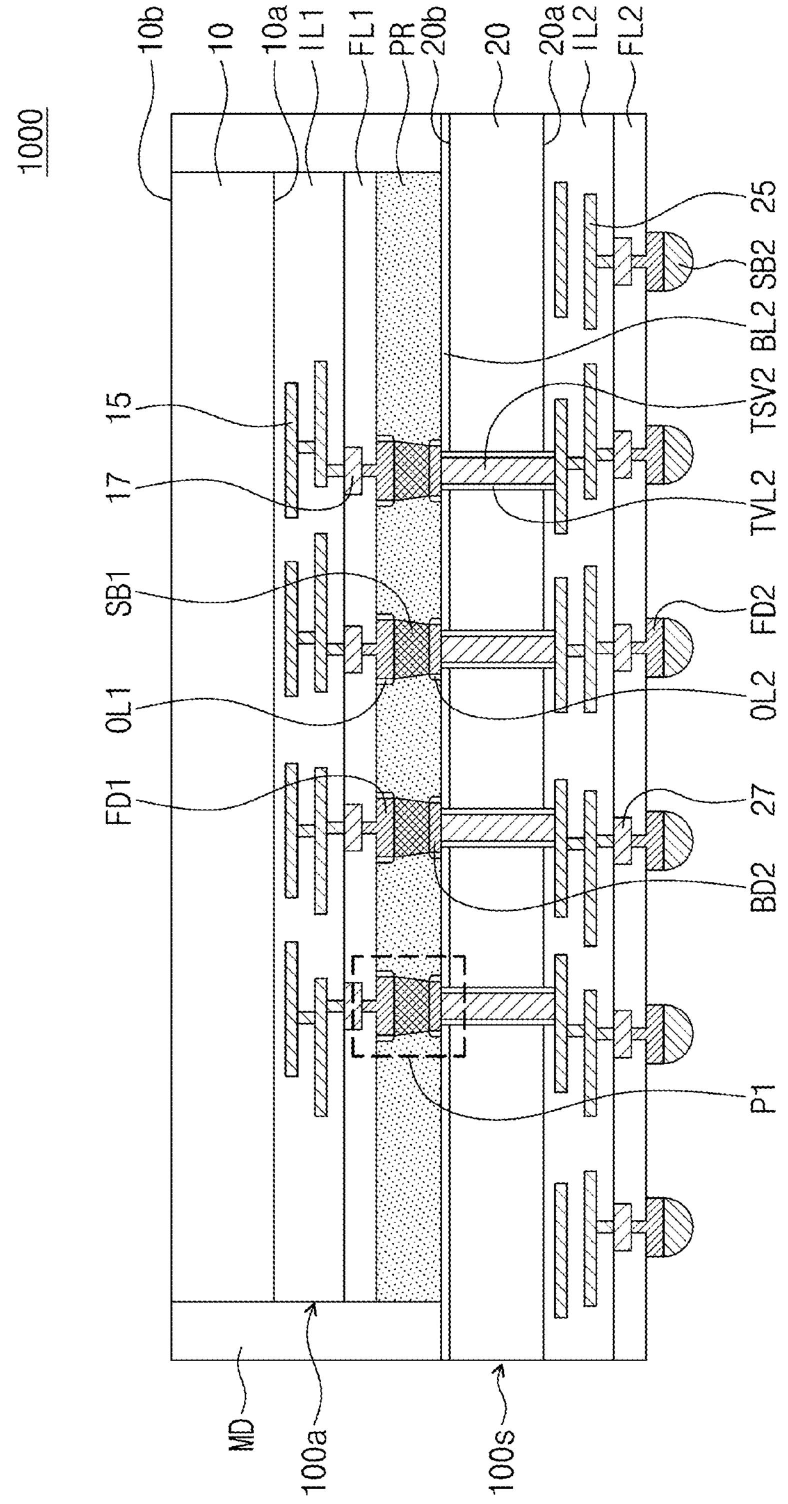
FIG. 1 is a cross-sectional view of a semiconductor package according to embodiments.

FIG. 1 is a cross-sectional view of a semiconductor package according to embodiments.

Referring to FIG. 1, a semiconductor package 1000 according to embodiments may include a buffer die 100*s*, a first semiconductor chip 100*a* mounted thereon, and a mold layer MD covering a sidewall thereof. The buffer die 100*s* may also be referred to as a 'lower structure'. The buffer die 100*s* may be, for example, an interposer or a logic circuit chip.

The first semiconductor chip 100*a* may also be referred to as an 'upper structure'. The first semiconductor chip 100*a* may be a memory chip. The memory chip may be, for example, a DRAM, NAND Flash, SRAM, MRAM, PRAM, or RRAM memory chip. The first semiconductor chip 100*a* may be replaced with a sub-semiconductor package.

The first semiconductor chip 100*a* may include a first semiconductor substrate 10. The first semiconductor substrate 10 may be a silicon single crystal substrate or a silicon on insulator (SOI) substrate. The first semiconductor substrate 10 may have a first front surface 10*a* and a first rear surface 10*b* that are opposite to each other. Transistors (not shown), a first interlayer insulating layer IL1, first wirings 15, first internal conductive pads 17, first front conductive pads FD1, and a first front passivation layer FL1 may be disposed on the first front surface 10*a*.

The first front conductive pad FD1 may also be referred to as a 'first chip conductive pad'. Side surfaces of the first front conductive pads FD1 may protrude out of the first front passivation layer FL1. The first front conductive pads FD1 may pass through the first front passivation layer FL1 and be in contact with the first internal conductive pads 17. The first rear surface 10*b* of the first semiconductor chip 100*a* may be coplanar with an upper surface of the mold layer MD.

The first interlayer insulating layer IL1 may have a single layer or may be a multilayer structure including at least one of silicon oxide, silicon oxynitride, silicon nitride, and a porous insulator. The first wirings 15 may include at least one of titanium, titanium nitride, tungsten, aluminum, and copper. The first internal conductive pad 17 may include a metal that is different from that of the first front conductive pad FD1. The first front passivation layer FL1 may include at least one of silicon oxide, silicon nitride, and silicon carbonization nitride.

The mold layer MD may include, for example, an insulating resin such as an epoxy-based molding compound (EMC). The mold layer MD may further include a filler. The filler may be dispersed in an insulating resin. The filler may include, for example, silicon oxide ($SiO_2$).

The buffer die 100*s* may include a second semiconductor substrate 20. The second semiconductor substrate 20 may be a silicon single crystal substrate or a silicon on insulator (SOI) substrate. The second semiconductor substrate 20 may have a second front surface 20*a* and a second rear surface 20*b* that are opposite to each other. A second interlayer insulating layer IL2, second wirings 25, second internal conductive pads 27, second front conductive pads FD2, and a second front passivation layer FL2 may be disposed on the second front surface 20*a*. Side surfaces of the second front conductive pads FD2 may protrude out of the second front passivation layer FL2. The second front conductive pads FD2 may pass through the second front passivation layer FL2 to be in contact with the second internal conductive pads 27. A second rear surface passivation layer BL2 and second rear surface conductive pads BD2 may be disposed on the second rear surface 20*b* of the buffer die 100*s*.

The buffer die 100*s* may further include second through-vias TSV2 passing through the second semiconductor substrate 20. Second via insulation layers TVL2 may be interposed between the second through-vias TSV2 and the second semiconductor substrate 20, respectively. The second through-via TSV2 and the second via insulating layer TVL2 may pass through portions of the second rear passivation layer BL2 and the second interlayer insulating layer IL2. One of the second through-vias TSV2 may connect one of the second wirings 25 to one of the second rear conductive pads BD2.

The second interlayer insulating layer IL2 may have a single layer structure or a multilayer structure including at least one of silicon oxide, silicon oxynitride, silicon nitride, and a porous insulator. The second wirings 25 may include at least one of titanium, titanium nitride, tungsten, aluminum, and copper. The second internal conductive pad 27 may include a metal different from that of the second front conductive pad FD2. The second front conductive pad FD2 and the second rear conductive pads BD2 may include at least one of copper, gold, and nickel. The second front passivation layer FL2 may include at least one of silicon oxide, silicon nitride, and silicon carbonitride. The second rear passivation layer BL2 may have a single layer structure or a multilayer structure of at least one of silicon oxide and silicon nitride. The second through-vias TSV2 may include at least one of copper and tungsten. The second via insulating layer TVL2 may include silicon oxide.

The first semiconductor chip 100*a* may be connected to the buffer die 100*s* through first solder balls SB1. For example, the first solder balls SB1 may include SnAg. A space between the first semiconductor chip 100*a* and the buffer die 100*s* may be filled with a photosensitive insulating layer PR. The first solder balls SB1 may also be referred to as 'internal connection members'.

The photosensitive insulating layer PR may include an epoxy resin, a dissolution inhibitor, a curing agent, and a filler. The epoxy resin may be a novolac resin. The epoxy resin may include a repeating unit having a structure represented by Chemical Formula 1 below.

<Chemical Formula 1>

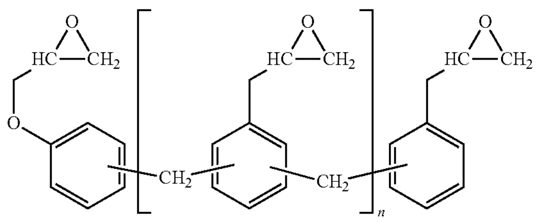

The dissolution inhibitor may be diazonaphthoquinone and may have a structure represented by Chemical Formula 2 below.

<Chemical Formula 2>

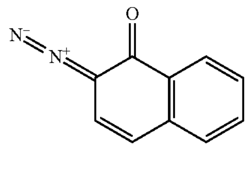

The curing agent may be an imidazole derivative and may have a structure represented by one or more of Chemical Formula 3 below.

<Chemical Formula 3

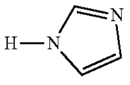

Imidazole (Im)

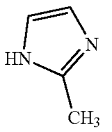

2-methylimidazole (2MI)

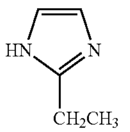

2-ethylimidazole (2EI)

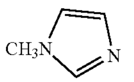

1-methylimidazole (1MI)

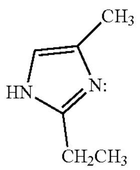

2-ethyl-4(5)-methylimidazole (2E4MI)

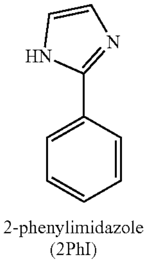

2-phenylimidazole (2PhI)

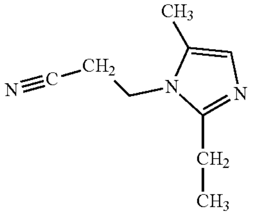

1-(2-cyanoethyl)-2-ethyl-4(5)-methylimidazole (2E4MCN)

The filler may be silica.

FIGS. 2A to 2E are enlarged views of the portion 'P' of FIG. 1 according to embodiments. FIG. 3 is a partial plan view illustrating a part of the first semiconductor chip.

Figure 2A:
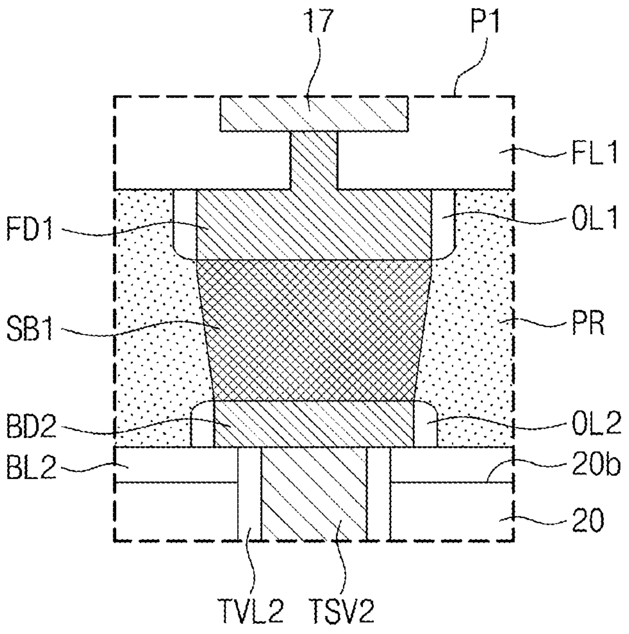
FIGS. 2A to 2E are enlarged views of portion 'P1' of FIG. 1 according to embodiments.
Figure 3:
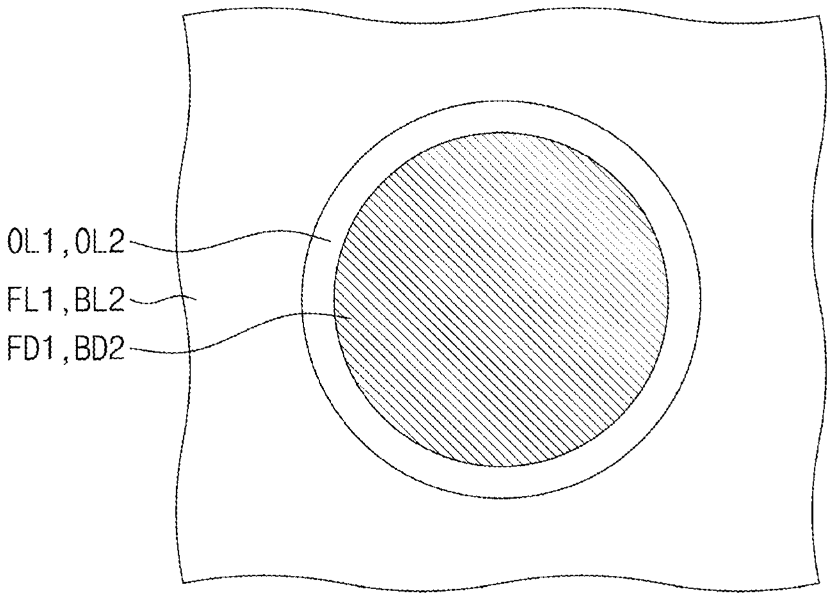
FIG. 3 is a partial plan view illustrating a part of the first semiconductor chip.

Referring to FIGS. 2A and 3, side surfaces of the first front conductive pad FD1 may be covered with a first organic insulating layer OL1. The first organic insulating layer OL1 may surround the first front conductive pad FD1. The first organic insulating layer OL1 may be interposed between the first front conductive pad FD1 and the photosensitive insulating layer PR:

A side surface of the second rear conductive pad BD2 may be covered with a second organic insulating layer OL2. The second organic insulating layer OL2 may surround the second rear conductive pad BD2. The second organic insulating layer OL2 may be interposed between the second rear conductive pad BD2 and the photosensitive insulating layer PR. Each of the first organic insulating layer OL1 and the second organic insulating layer OL2 may include an imidazole derivative. The imidazole derivative may have a structure selected from the structures shown in Chemical Formula 3. In FIG. 2A, a side surface of the first solder ball SB1 may be in contact with the photosensitive insulating layer PR.

Figure 2B:
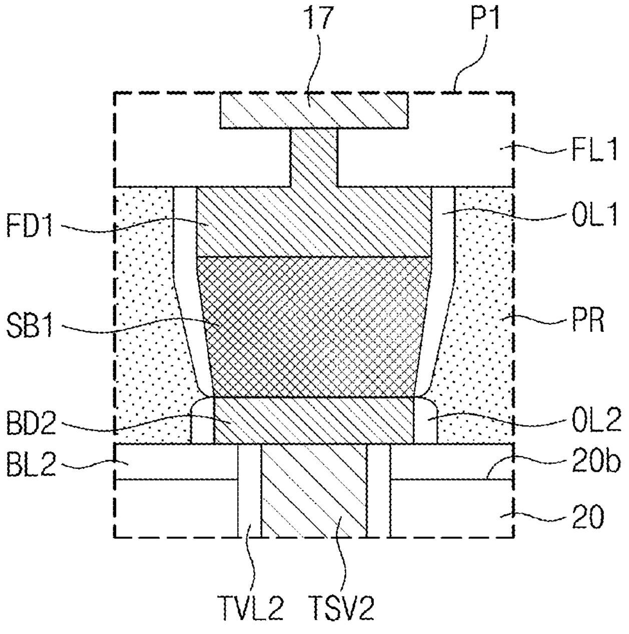

In some implementations, referring to FIG. 2B, the first organic insulating layer OL1 may extend to cover the side surface of the first solder ball SB1. The first organic insulating layer OL1 may be in contact with the second organic insulating layer OL2.

Figure 2C:
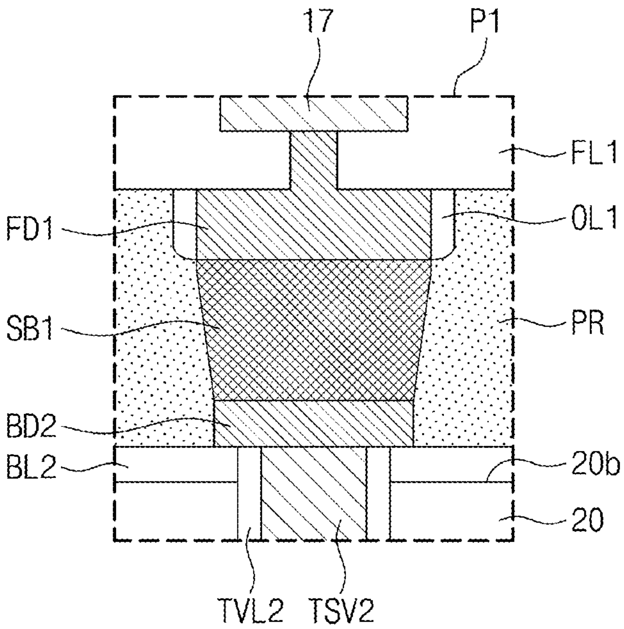

In some implementations, referring to FIG. 2C, side surfaces of the second rear conductive pad BD2 may be in contact with the photosensitive insulating layer PR without being covered with the second organic insulating layer OL2.

Figure 2D:
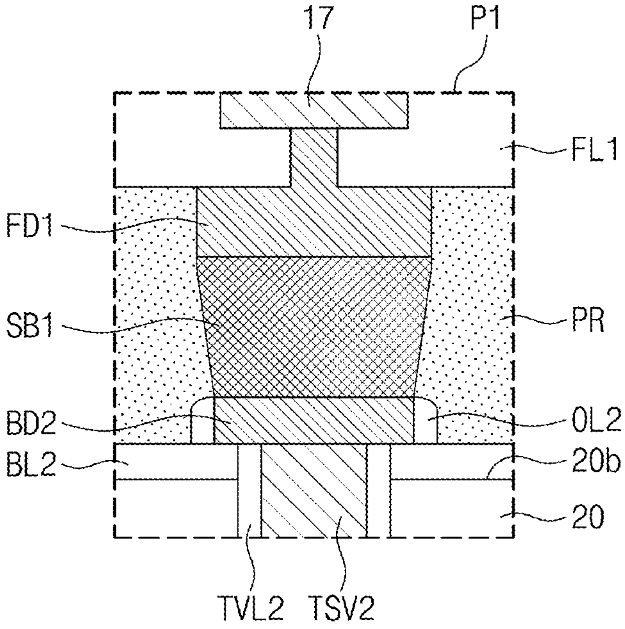

In some implementations, referring to FIG. 2D, side surfaces of the first front conductive pad FD1 may be in contact with the photosensitive insulating layer PR without being covered with the first organic insulating layer OL1.

Figure 2E:
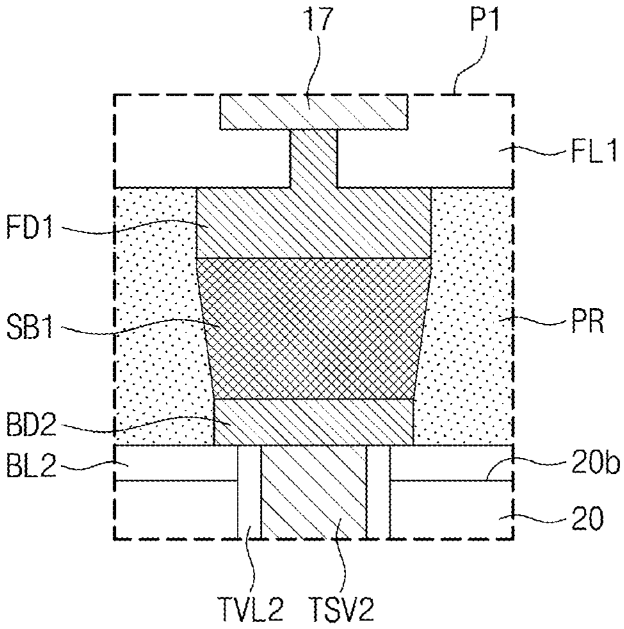

In some implementations, referring to FIG. 2E, side surfaces of the first front conductive pad FD1 and the second rear conductive pad BD2 may be in contact the photosensitive insulating layer PR.

The first and second organic insulating layers OL1 and OL2 of the semiconductor package 1000 according to the present example may prevent a short between adjacent first solder balls SB1. Accordingly, the reliability of the semiconductor package 1000 may be improved. In addition, the photosensitive insulating layer PR may improve the reliability of the semiconductor package 1000 by filling a space between the semiconductor chip 100*a* and the buffer die 100*s*.

The first and second organic insulating layers OL1 and OL2 may also be referred to as an 'organic solderability preservative (OSP)'.

Figure 4:
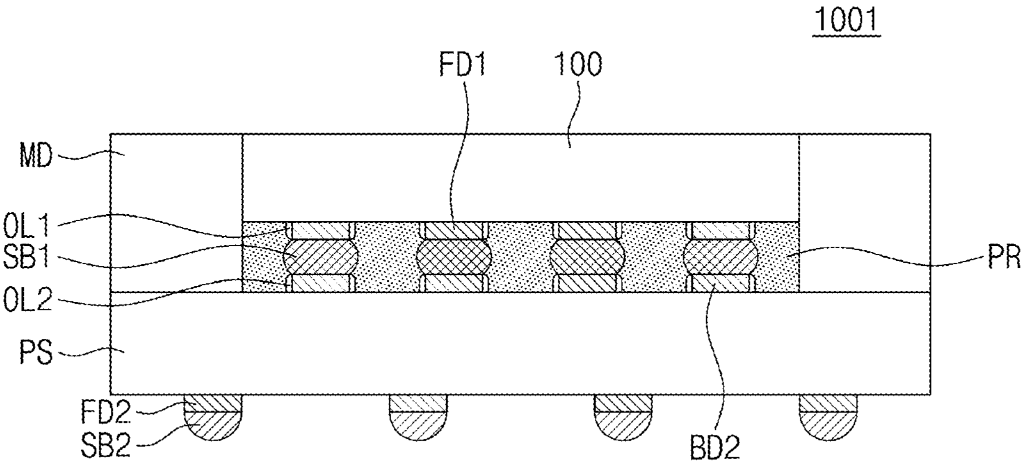
FIG. 4 is a cross-sectional view of a semiconductor package according to embodiments.

FIG. 4 is a cross-sectional view of a semiconductor package according to embodiments.

Referring to FIG. 4, a semiconductor package 1001 according to the present example may include a package substrate PS, a semiconductor chip 100 mounted thereon, and a mold layer MD covering the package substrate PS. The semiconductor chip 100 may be one selected from an image sensor such as a CMOS imaging sensor (CIS), a memory device chip such as flash memory chip, a DRAM chip, an SRAM chip, an EEPROM chip, a PRAM chip, an MRAM chip, a ReRAM chip, a high bandwidth memory (HBM) chip, a microelectromechanical system (MEMS) device chip, or an application-specific integrated circuit (ASIC, customized semiconductor) chip. The semiconductor chip 100 may include first front conductive pads FD1 disposed thereon.

The package substrate PS may also be referred to as a 'lower structure'. The package substrate PS may be a double-sided or multi-layer printed circuit board. The package substrate PS may also include second rear conductive pads BD2 disposed on an upper side thereof and second front conductive pads FD2 disposed on a lower side thereof. The second front conductive pads FD2 may also be referred to as 'first substrate conductive pads'. The package substrate PS may further include a body layer and solder resist layers disposed on upper and lower surfaces of the body layer. A thermosetting resin such as an epoxy resin, a thermoplastic resin such as polyimide, or a resin impregnated with a reinforcing material such as glass fiber and/or an inorganic filler (e.g., prepreg or FR4 (fire resist-4)), and/or a photo-curable resin may be used as the body layer, as examples.

First solder balls SB1 may connect the first front conductive pads FD1 to the second rear conductive pads BD2, respectively. Side surfaces of the first front conductive pads FD1 may be covered with first organic insulating layers OL1, respectively. Side surfaces of the second rear conductive pads BD2 may be covered with second organic insulating layers OL2, respectively. Second solder balls SB2 may be bonded to the second front conductive pads FD2, respectively. A space between the package substrate PS and the semiconductor chip 100 may be filled with a photosensitive insulating layer PR. Other structures may be the same as, or similar to, those described above.

Figure 5:
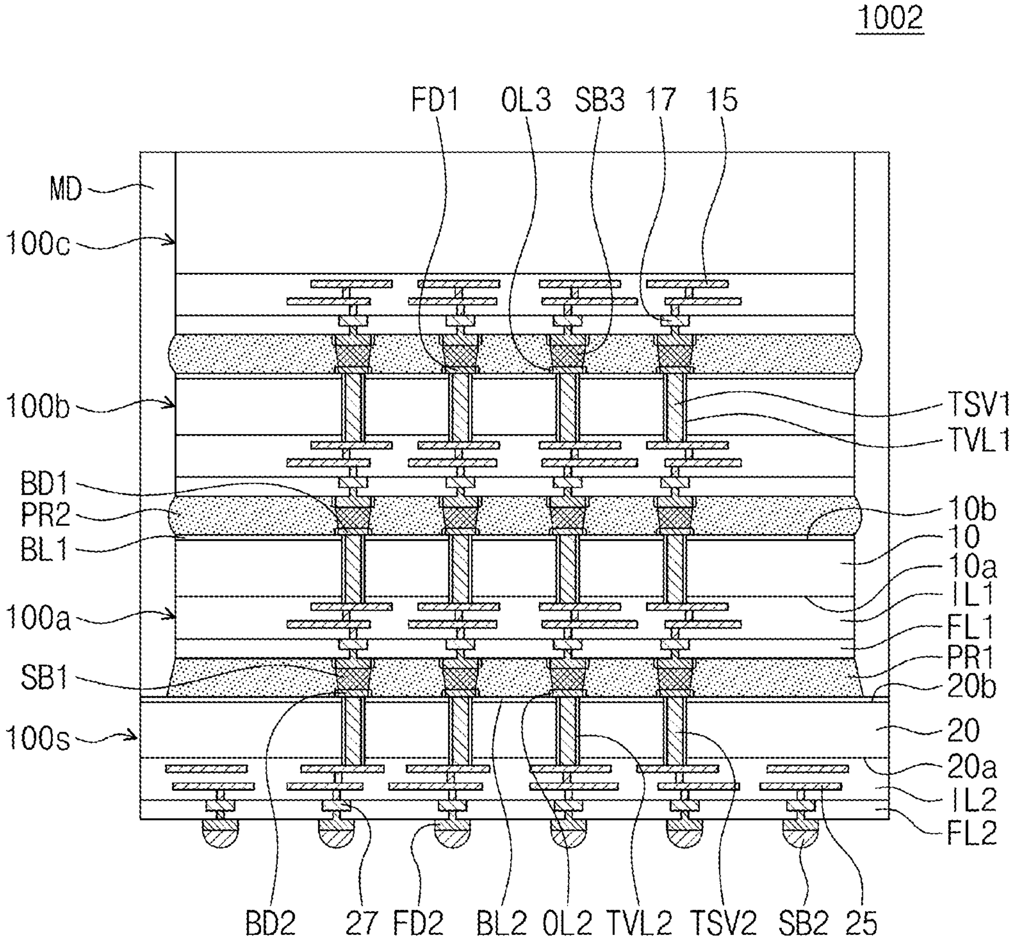
FIG. 5 is a cross-sectional view of a semiconductor package according to embodiments.

FIG. 5 is a cross-sectional view of a semiconductor package according to embodiments.

Referring to FIG. 5, a semiconductor package 1002 according to the present example may include a buffer die 100*s*, first to third semiconductor chips 100*a*, 100*b*, and 100*c* sequentially stacked thereon, and a mold layer MD covering the buffer die 100*s*. The first to third semiconductor chips 100*a*, 100*b*, and 100*c* may be memory chips that perform a same function as each other.

The buffer die 100*s* and the first semiconductor chip 100*a* may be connected by first solder balls SB1. The first to third semiconductor chips 100*a*, 100*b*, and 100*c* may be connected by third solder balls SB3.

The first to third semiconductor chips 100*a*, 100*b*, and 100*c* may each have the same or similar structure as the first semiconductor chip 100*a* of FIG. 1. The first and second semiconductor chips 100*a* and 100*b* may further include a first through-via TSV1 and a first via insulation layer TVL1 penetrating a first semiconductor substrate 10. In the first and second semiconductor chips 100*a* and 100*b*, a first rear side passivation layer BL1 and first rear side conductive pads BD1 may be disposed on a first rear surface 10*b* of the first semiconductor substrate 10. The first rear passivation layer BL1 may include the same material as that of a second rear passivation layer BL2. The first rear surface conductive pads BD1 may include the same material as that of a second rear surface conductive pads BD2.

Side surfaces of the first rear conductive pads BD1 may be covered with third organic insulating layers OL3. A space between the buffer die 100*s* and the first semiconductor chip 100*a* may be filled with a first photosensitive insulating layer PR1. Spaces between the first to third semiconductor chips 100*a*, 100*b*, and 100*c* may be filled with second photosensitive insulating layers PR2. The first photosensitive insulating layer PR1 and the second photosensitive insulating layers PR2 may be the same as the photosensitive insulating layer PR described with reference to FIG. 1.

Figure 6:
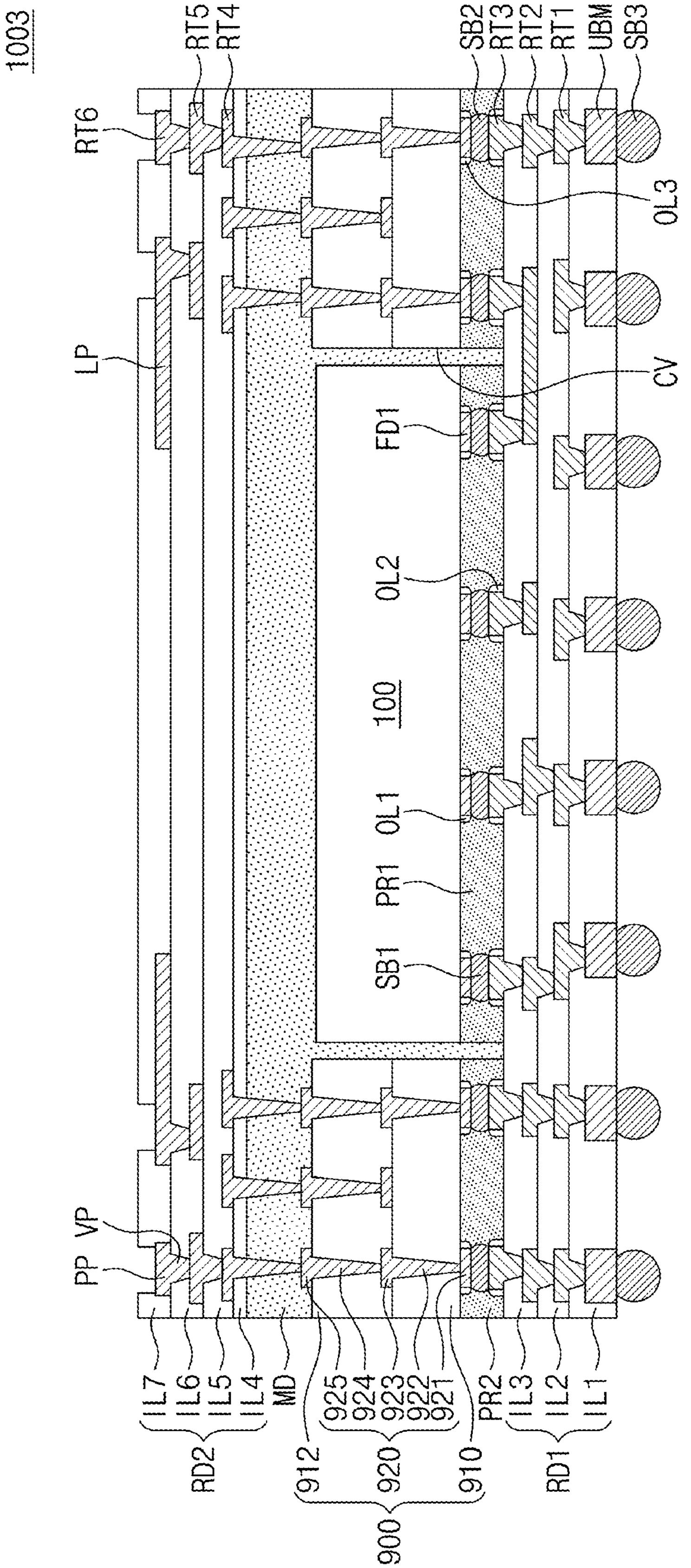
FIG. 6 is a cross-sectional view of a semiconductor package according to embodiments.

FIG. 6 is a cross-sectional view of a semiconductor package according to embodiments.

Referring to FIG. 6, a semiconductor package 1003 according to the present example may have a chip last fan-out panel level package (FOPLP) form. The semiconductor package 1003 may include a first redistribution substrate RD1 and a semiconductor chip 100 mounted thereon. The first redistribution substrate RD1 may also be referred to as a 'lower structure'. A connection substrate 900 having a cavity CV at a center thereof may be disposed on the first redistribution substrate RD1. The connection substrate 900 and the semiconductor chip 100 may also be referred to as an 'upper structure'.

The semiconductor chip 100 may be inserted into the cavity CV. The semiconductor chip 100 and the connection substrate 900 may be covered with a mold layer MD. A portion of the mold layer MD may be inserted into the cavity CV and interposed between the semiconductor chip 100 and the connection substrate 900. A second redistribution substrate RD2 may be disposed on the mold layer MD. In the present specification, a 'redistribution substrate' may also be referred to as a 'package substrate', a 'redistribution layer', or a 'redistribution structure'.

The first redistribution substrate RD1 may include first to third interlayer insulating layers IL1, IL2, and IL3 sequentially stacked. Each of the first to third interlayer insulating layers IL1, IL2, and IL3 may include a photo imageable dielectric (PID) layer. Lower bonding pads UBM may be disposed in the first interlayer insulating layer IL1.

A first redistribution pattern RT1 may be interposed between the first interlayer insulating layer IL1 and the second interlayer insulating layer IL2. A second redistribution pattern RT2 may be interposed between the second interlayer insulating layer IL2 and the third interlayer insulating layer IL3. A third redistribution pattern RT3 is disposed on the third interlayer insulating layer IL3.

Third solder balls SB3 may be bonded to the lower bonding pads UBM, respectively. At least some of the first to third redistribution patterns RT1 to RT3 may include a via portion VP that penetrates the interlayer insulating layers IL1, IL2, and IL3, respectively, a pad portion PP, and a line portion LP that connects the via portion VP and the pad portion PP. A side surface of the via portion VP may be inclined. The via portion VP may have a narrower width from top to bottom. The lower bonding pads UBM and the first to third redistribution patterns RT1 to RT3 may include, for example, a metal such as copper, aluminum, gold, nickel, or titanium. A diffusion barrier layer may be interposed between the first to third redistribution patterns RT1 to RT3 and the interlayer insulating layers IL1, IL2, and IL3, respectively. The diffusion barrier layer may include, for example, titanium, tantalum, titanium nitride, tantalum nitride, or tungsten nitride.

The semiconductor chip 100 may include first front conductive pads FD1. The semiconductor chip 100 may be bonded to the third redistribution patterns RT3 of the first redistribution substrate RD1 by first solder balls SB1.

The connection substrate 900 may include a plurality of base layers 910 and 912 and a conductive structure 920. The base layers 910 and 912 may include, for example, a first base layer 910 and a second base layer 912 composed of two layers. The base layers 910 and 912 may include three or more base layers. The base layers 910 and 912 may include an insulating material. For example, the base layers 910 and 912 may include a carbon-based material, ceramic, or polymer.

The conductive structure 920 may include a connection pad 921, a first connection via 922, a first connection wiring 923, a second connection via 924, and a second connection wiring 925. In this example, the first connection via 922 and the first connection wiring 923 may be integrally formed. The second connection via 924 and the second connection wiring 925 may be integrally formed. The conductive structure 920 may include a metal such as copper, aluminum, gold, nickel, or titanium. A side surface of the connection pad 921 may be covered with a third organic insulating layer OL3.

The second redistribution substrate RD2 may include fourth to seventh interlayer insulating layers IL4, IL5, IL6, and IL7 sequentially stacked. Each of the fourth to seventh interlayer insulating layers IL4, IL5, IL6, and IL7 may include a photo imageable dielectric layer. A fourth redistribution pattern RT4 may be interposed between the fourth interlayer insulating layer IL4 and the fifth interlayer insulating layer IL5. A fifth redistribution pattern RT5 may be interposed between the fifth interlayer insulating layer IL5 and the sixth interlayer insulating layer IL6. A sixth redistribution pattern RT6 may be interposed between the sixth interlayer insulating layer IL6 and the seventh interlayer insulating layer IL7.

Similar to the first to third redistribution patterns RT1, RT2, and RT3, at least some of the fourth to sixth redistribution patterns RT4, RT5, and RT6 may include a via portion VP, a pad portion PP, and a line portion LP. The seventh interlayer insulating layer IL7 may include a plurality of upper pad holes exposing the pad portions PP of the sixth redistribution patterns RT6. A diffusion barrier layer may be interposed between the fourth to sixth redistribution patterns RT4 to RT6 and the fourth to sixth interlayer insulating layers IL4, IL5, and IL6, respectively.

The via portions VP of the fourth redistribution pattern RT4 may pass through the fourth interlayer insulating layer IL4 and the mold layer MD to be connected to the second connection wiring 925.

The connection pad 921 of the connection substrate 900 may be bonded to the third redistribution patterns RT3 of the first redistribution substrate RD1 by second solder balls SB2.

The semiconductor chip 100 may be spaced apart from the first redistribution substrate RD1 and a first photosensitive insulating layer PR1 may be interposed therebetween. The connection substrate 900 may be spaced apart from the first redistribution substrate RD1 and a second photosensitive insulating layer PR2 may be interposed therebetween. Other configurations may be the same/similar to those described above.

FIGS. 7A to 7I are cross-sectional views illustrating a process of fabricating the semiconductor package of FIG. 1 according to embodiments.

Figure 7A:
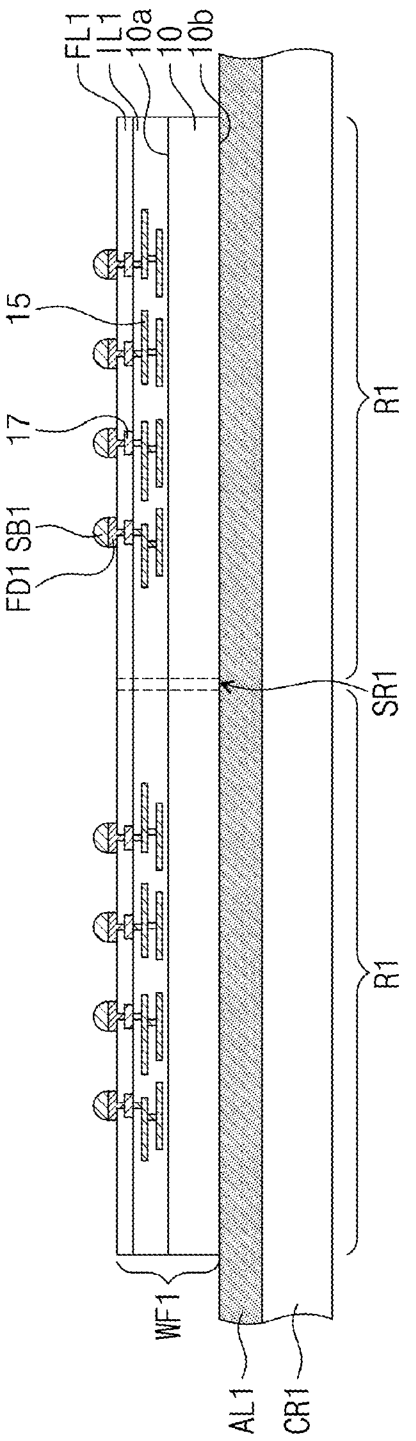
FIGS. 7A to 7I are cross-sectional views illustrating a process of fabricating the semiconductor package of FIG. 1 according to embodiments.

Referring to FIG. 7A, a first wafer structure WF1 is prepared. The first wafer structure WF1 may have a plurality of first chip regions R1 and a first separation region SR1 therebetween. The first separation region SR1 may be a scribe lane region. The first wafer structure WF1 may include a first semiconductor substrate 10. The first semiconductor substrate 10 may include a first front surface 10*a* and a first rear surface 10*b* that are opposite to each other. Transistors (not shown), a first interlayer insulating layer IL1, first wirings 15, first internal conductive pads 17, a first front passivation layer FL1, and first front conductive pads FD1 are formed on the first front surface 10*a*. First solder balls SB1 may be bonded on the first front conductive pads FD1. The first rear surface 10*b* of the first wafer structure WF1 may be attached to a first carrier substrate CR1 through a first adhesive layer AL1.

Figure 7B:
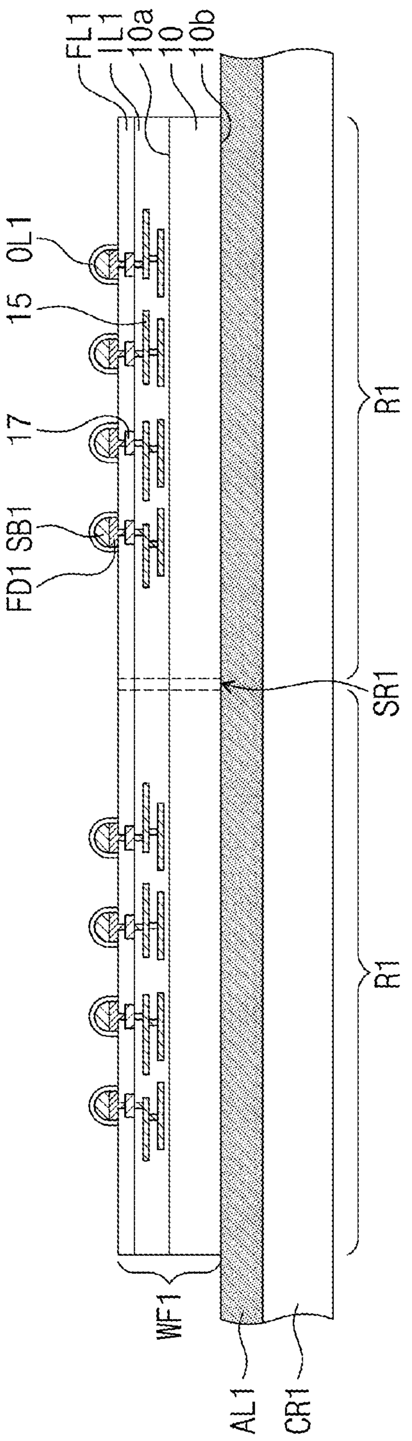

Referring to FIG. 7B, first organic insulating layers OL1 may be formed to cover surfaces of the first solder balls SB1 and side surfaces of the first front conductive pads FD1. The first organic insulating layers OL1 may be selectively formed only on the surfaces of the first solder balls SB1 and the side surfaces of the first front conductive pads FD1. To form the first organic insulating layers OL1, a composition containing an imidazole derivative may be coated on the first front passivation layer FL1, and then a cleaning process may be performed. The imidazole derivative may have a structure of one of those shown in Chemical Formula 3. The imidazole derivative may be selectively combined only with the surfaces of the first solder balls SB1 and the side surfaces of the first front conductive pads FD1 to form the first organic insulating layers OL1. The cleaning process may be performed using, for example, water. The first organic insulating layers OL1 may prevent the surfaces of the first solder balls SB1 from being oxidized.

Figure 7C:
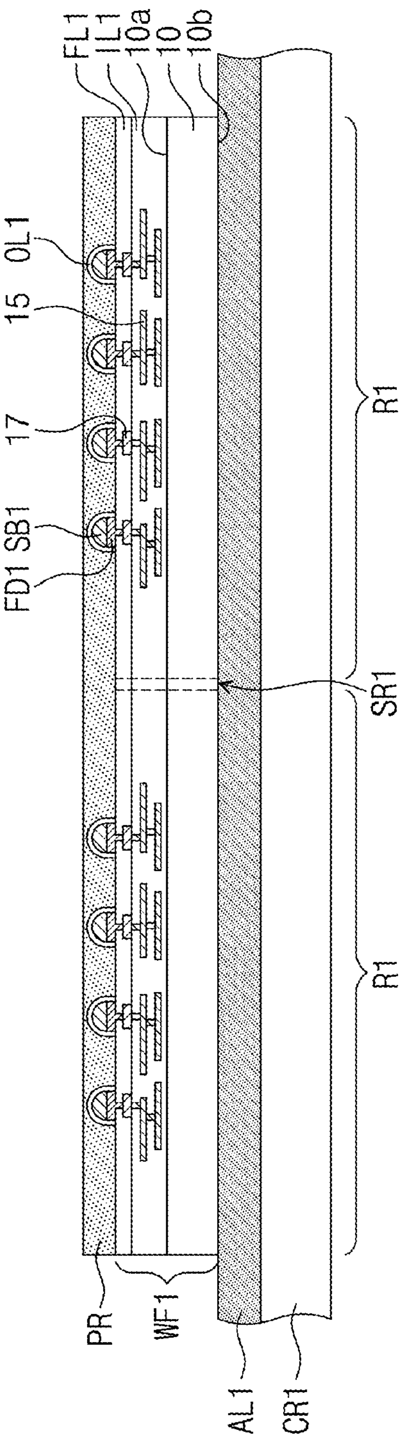

Referring to FIG. 7C, a photosensitive composition may be coated onto the first front passivation layer FL1 and cured to form a photosensitive insulating layer PR. The photosensitive composition may include an epoxy resin, a dissolution inhibitor, a curing agent, and a filler. The epoxy resin may be a novolac resin. The epoxy resin may have a repeating unit of the structure as depicted in Chemical Formula 1. The dissolution inhibitor may be diazonaphthoquinone and may have a structure as depicted in Chemical Formula 2. The curing agent may be an imidazole derivative and may have a structure of one of those depicted in Chemical Formula 3. The filler may be silica.

Figure 7D:
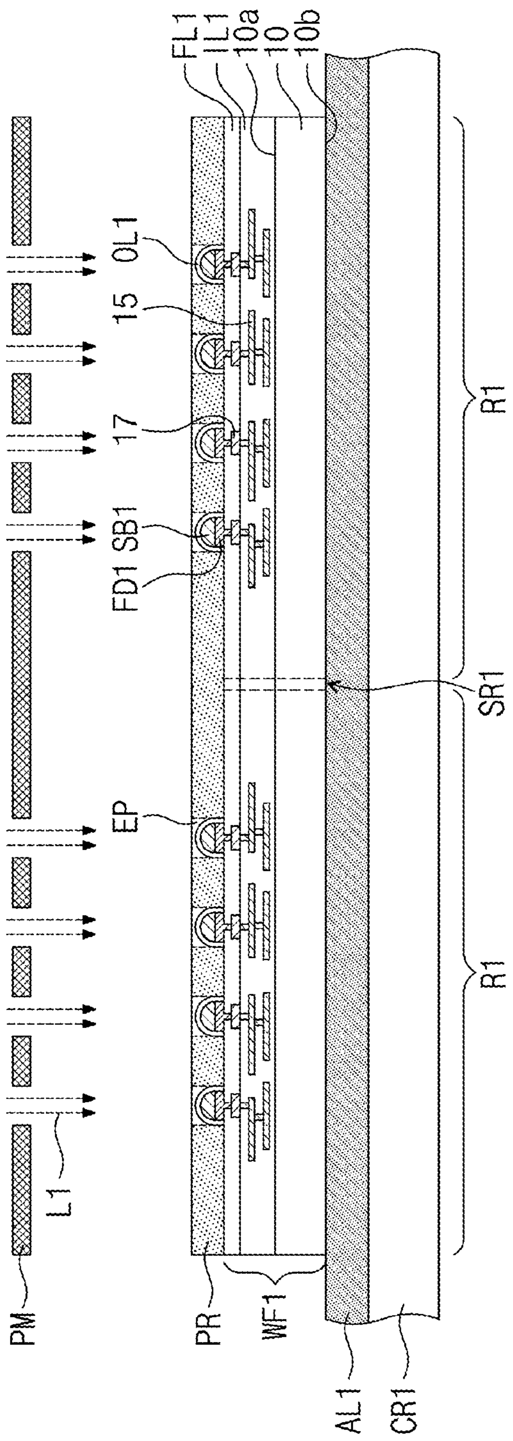

Referring to FIG. 7D, an exposure process may be performed using a photo mask PM. In a portion EP irradiated with light L1 of the photosensitive insulating layer PR, diazonaphthoquinone, which is a curing agent, is changed to a state having a carboxyl group (COOH) that is easily soluble in a solvent through the following process (Reaction Formula).

<Reaction Formula>

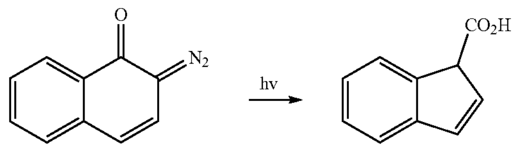

The exposure process may be performed using, for example, I line UV with a wavelength of 365 nm.

Figure 7E:
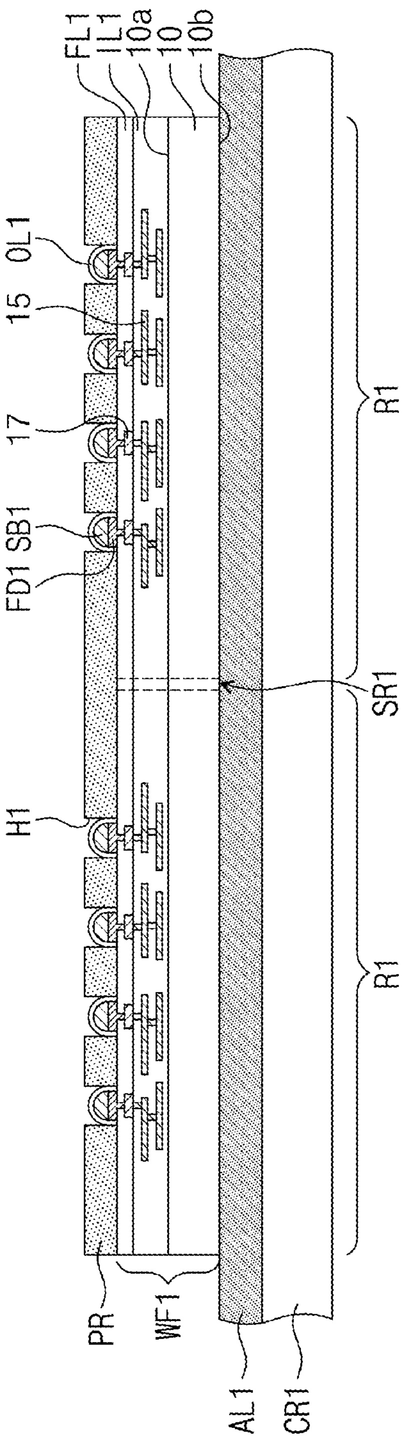

Referring to FIGS. 7D and 7E, a developing process may be performed to remove the portion EP irradiated with the light L1 and form a plurality of first holes H1 exposing the first organic insulating layers OL1. The developing process may be performed using, for example, tetramethylammonium hydroxide (TMAH).

Figure 7F:
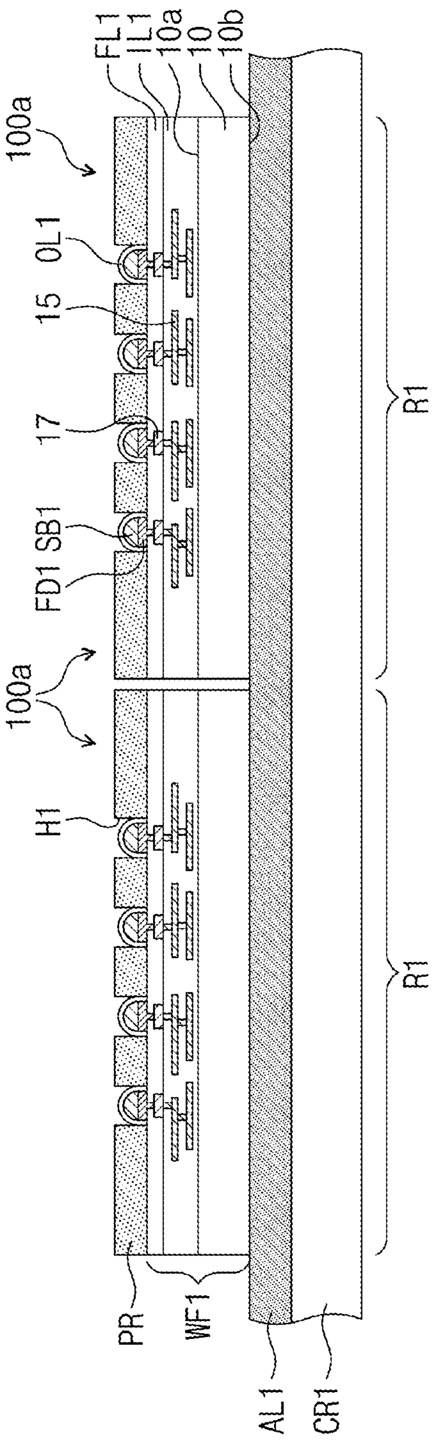

Referring to FIG. 7F, a plurality of first semiconductor chips 100*a* may be fabricated by cutting the first wafer structure WF1 in the first separation region SR1 by performing a sawing process using a blade or a laser. The first semiconductor chips 100*a* may be separated from the first carrier substrate CR1. To this end, light may be irradiated through the first carrier substrate CR1. The first adhesive layer AL1 may lose adhesiveness due to light irradiated through the first carrier substrate CR1. As a result, the first semiconductor chips 100*a* may be easily separated from the first carrier substrate CR1.

Figure 7G:
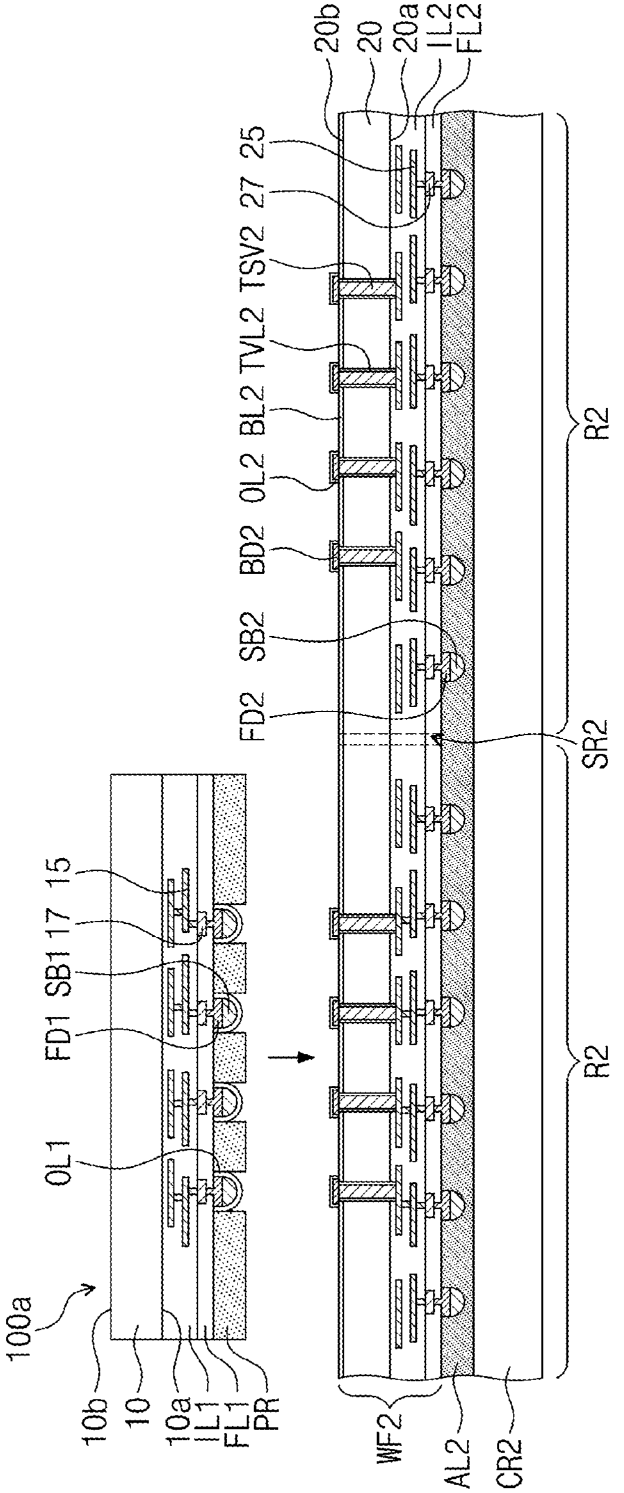

Referring to FIG. 7G, a second wafer structure WF2 may be prepared. The second wafer structure WF2 may include a plurality of second chip regions R2 and a second separation region SR2 therebetween. The second separation region SR2 may be a scribe lane region. The second wafer structure WF2 may include a second semiconductor substrate 20. The second semiconductor substrate 20 may include a second front surface 20*a* and a second rear surface 20*b* that are opposite to each other. Transistors (not shown) and a second interlayer insulating layer IL2 may be formed on the second front surface 20*a*. The second interlayer insulating layer IL2 and the second semiconductor substrate 20 may be etched to provide a through hole. A second via insulating layer TVL2 and a second through-via TSV2 may be formed in the through hole. Second wirings 25 may be formed on the second interlayer insulating layer IL2, and second internal conductive pads 27, a second front passivation layer FL2, and second front conductive pads FD2 may be formed thereon. Second solder balls SB2 may be bonded on the second front conductive pads FD2.

The second wafer structure WF2 may be attached onto a second carrier substrate CR2 through a second adhesive layer AL2. A rear grinding process may be performed on the second rear surface 20*b* of the second semiconductor substrate 20 to partially remove the second semiconductor substrate 20 and expose the second via insulation layer TVL2. A second rear surface passivation layer BL2 may be deposited on the second rear surface 20*b* of the second semiconductor substrate 20 and etched back to remove the second via the insulation layer TVL2 and expose the second through-via TSV2. Second rear surface conductive pads BD2 may be formed on the second rear surface passivation layer BL2.

Second organic insulating layers OL2 may be formed on the second rear surface conductive pads BD2 to cover side surfaces of the second rear surface conductive pads BD2. The second organic insulating layers OL2 may be selectively formed only on the side surfaces of the second rear surface conductive pads BD2. To form the second organic insulating layers OL2, a composition including an imidazole derivative may be coated onto the second rear passivation layer BL2, and then a cleaning process may be performed. The imidazole derivative may have the structure as represented by Chemical Formula 3. The imidazole derivative may be selectively combined only with the side surfaces of the second rear surface conductive pads BD2 to form the second organic insulating layers OL2. The cleaning process may be performed using, for example, water. The second organic insulating layers OL2 may prevent the surfaces of the second rear surface conductive pads BD2 from being oxidized.

The first semiconductor chips 100*a* of FIG. 7F may be positioned on the second wafer structure WF2. In this case, the first semiconductor chip 100*a* may be positioned such that the first solder balls SB1 overlap the second rear surface conductive pads BD2.

Figure 7H:
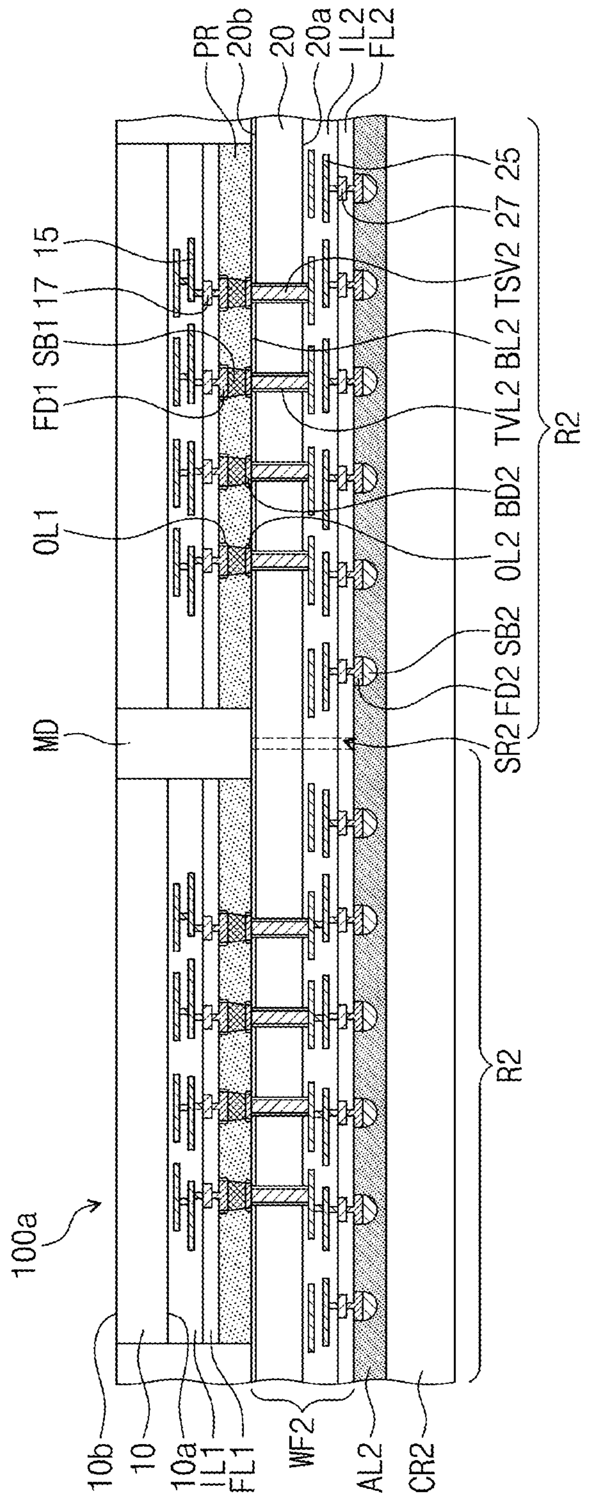

Referring to FIGS. 7G and 7H, a thermal compression process may be performed to bond the first semiconductor chips 100*a* to the second wafer structure WF2. In this case, the first solder balls SB1 may penetrate the first organic insulating layers OL1 and the second organic insulating layers OL2 to be bonded to the second rear surface conductive pads BD2. Also, a photosensitive insulating layer PR may be melted to fill a space between the first semiconductor chip 100*a* and the second wafer structure WF2. A molding process may be performed to form a mold layer MD that fills the space between the first semiconductor chips 100*a*.

Figure 7I:
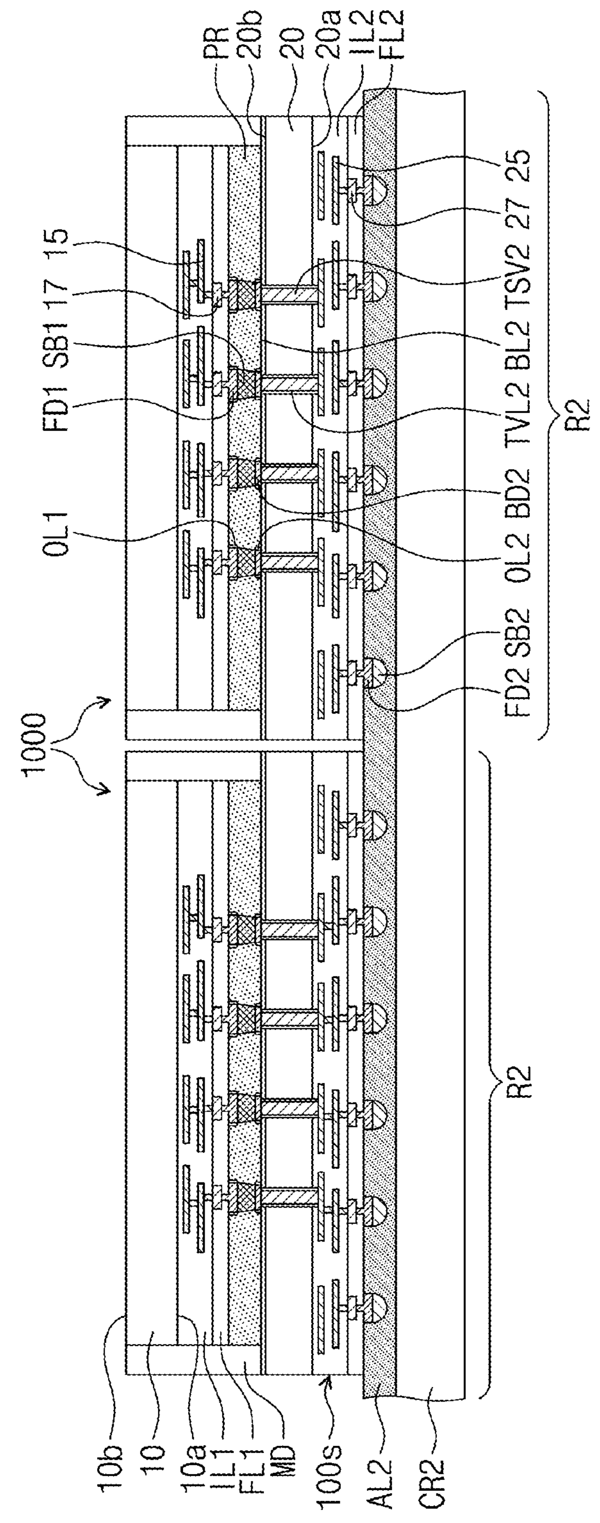

Referring to FIG. 7I, a sawing process may be performed using a blade or a laser to cut the mold layer MD and the second wafer structure WF2 on the second separation region SR2 to form a plurality of semiconductor packages 1000. The semiconductor packages 1000 may be separated from the second carrier substrate CR2. To this end, light may be irradiated through the second carrier substrate CR2. The second adhesive layer AL2 may lose adhesiveness due to light irradiated through the second carrier substrate CR2. Accordingly, the semiconductor packages 1000 may be easily separated from the second carrier substrate CR2. As a result, the semiconductor package 1000 of FIG. 1, FIG. 2A or FIG. 2B may be fabricated.

Figure 8A:
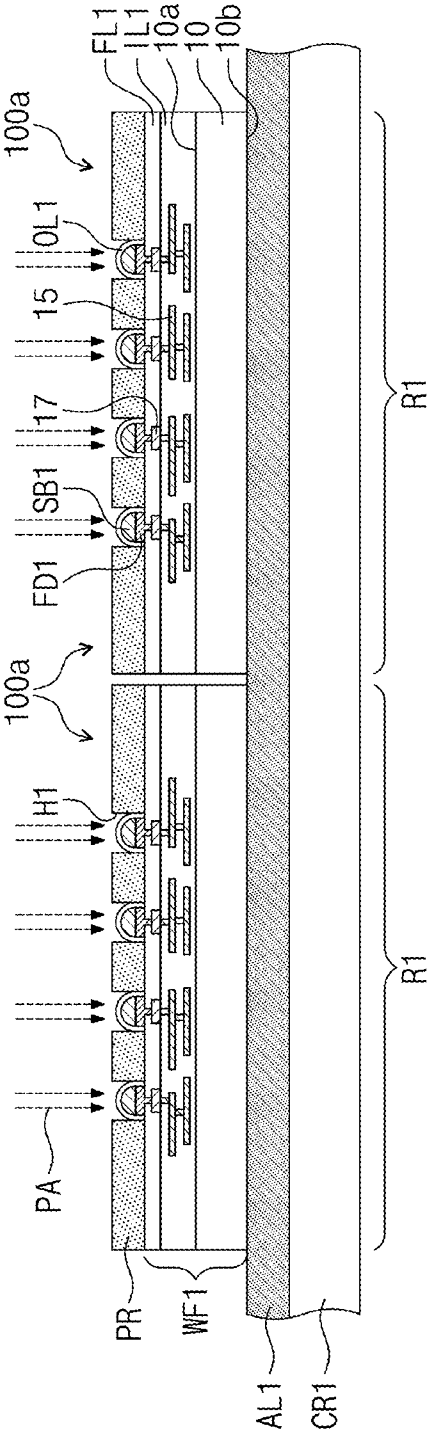
FIGS. 8A and 8B are cross-sectional views illustrating a process of fabricating the semiconductor package of FIG. 1 according to embodiments.
Figure 8B:
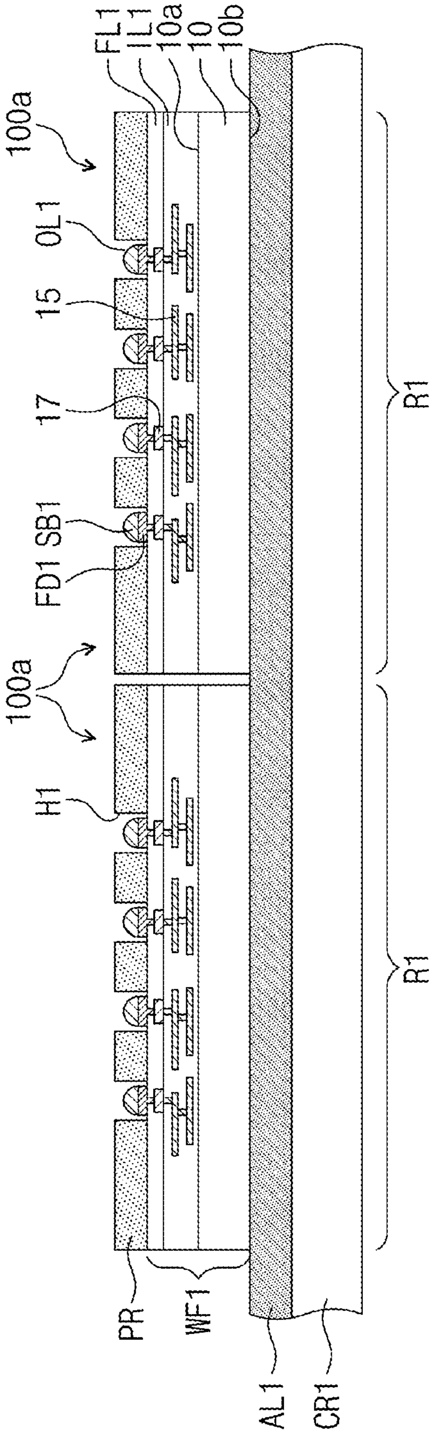

FIGS. 8A and 8B ad are cross-sectional views illustrating a process of fabricating the semiconductor package of FIG. 1 according to embodiments.

Referring to FIG. 8A, a process of removing the first organic insulating layers OL1 may be performed after the step of FIG. 7F and before the step of FIG. 7G. The first organic insulating layers OL1 may be removed using plasma PA. The process of removing the first organic insulating layers OL1 may be a plasma treatment process. The plasma treatment process may be performed using at least one of nitrogen, argon, and hydrogen.

Referring to FIG. 8B, the first organic insulating layers OL1 may be removed to expose the surfaces of the first solder balls SB1 and the side surfaces of the first front conductive pad FD1 in first holes H1. Subsequently, the first semiconductor chip 100*a* of FIG. 8B may be bonded onto the second wafer structure WF2 on which the second organic insulating layers OL2 of FIG. 7G are formed. When subsequent processes are performed, a semiconductor package 1000 having the structure of FIG. 2D may be formed.

In the method of fabricating a semiconductor package, a non-conductive film (NCF) may be omitted when bonding the first semiconductor chip 100*a* onto the second wafer structure WF2. In this case, there is a possibility that the NCF may remain between the first solder balls SB1 and the second rear surface conductive pads BD2 during the bonding process. As a result, open defects, such as non-contact between the first solder balls SB1 and the second rear surface conductive pads BD2, or joint cracks, could occur.

The first and second organic insulating layers and the photosensitive insulating layer are used as the OSP, instead of the NCF. Because the first and second organic insulating layers OL1 and OL2 are much thinner than the non-conductive film (NCF), they do not remain between the first solder balls SB1 and the second rear surface conductive pads BD2 in the bonding process. In addition, desired portions of the photosensitive insulating layer PR may be cleanly removed through the exposure and developing processes to form the first holes H1. As a result, the photosensitive insulating layer PR may not remain between the first solder balls SB1 and the second rear surface conductive pads BD2 in the bonding process, which may prevent open defects or joint cracks. Also, the first and second organic insulating layers OL1 and OL2 may prevent a short from occurring between adjacent first solder balls SB1 during the bonding process. Accordingly, the reliability of the semiconductor package may be improved and the process yield may be improved.

According to an example, in the plasma treatment process, the first organic insulating layers OL1 may be partially removed and partially remain, and thus may cover the side surfaces of the first front conductive pads FD1 while the first solder balls SB1 are exposed. In addition, when a subsequent process is performed in this state, the semiconductor package of FIG. 2A may be fabricated.

In the step of FIG. 7G, forming the second organic insulating layers OL2 may be omitted. When subsequent processes are performed in this state, the semiconductor package of FIG. 2C may be fabricated.

In some implementations, forming the first organic insulating layers OL1 in the step of FIG. 7B may be omitted. When subsequent processes are performed in this state, the semiconductor package of FIG. 2D may be fabricated.

In some implementations, all of the steps of forming the first organic insulating layers OL1 and the second organic insulating layers OL2 may be omitted. When subsequent processes are performed in this state, the semiconductor package of FIG. 2E may be fabricated.

In some implementations the first and second organic insulating layers and the photosensitive insulating layer may be used as the OSP, instead of the NCF. Doing so may prevent an open defect or a joint crack from occurring. Accordingly, the reliability of the semiconductor package may be improved and the process yield may be improved.

By way of summation and review, embodiments provide a semiconductor package that has improved reliability. Embodiments further provide a method of fabricating a semiconductor package with improved yield. Issues addressed herein are not limited to those mentioned above. Other issues not mentioned will be clearly understood by those skilled in the art Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package comprising:

a lower structure including a first lower conductive pad disposed on an upper surface thereof;

a first semiconductor chip disposed on the lower structure, the first semiconductor chip including a first chip conductive pad disposed on a lower surface thereof;

a solder ball connecting the first lower conductive pad and the first chip conductive pad;

a photosensitive insulating layer filling a space between the lower structure and the first semiconductor chip; and a first organic insulating layer covering a side surface of the first chip conductive pad, wherein the photosensitive insulating layer includes an epoxy resin, a dissolution inhibitor, a curing agent, and a filler.

2. The semiconductor package as claimed in claim 1, further including a second organic insulating layer covering a side surface of the first lower conductive pad.

3. The semiconductor package as claimed in claim 1, wherein the first organic insulating layer extends to cover a side surface of the solder ball.

4. The semiconductor package as claimed in claim 3, further including a second organic insulating layer covering a side surface of the first lower conductive pad and in contact with the first organic insulating layer.

5. The semiconductor package as claimed in claim 1, wherein:

the epoxy resin is a novolac resin, the dissolution inhibitor is diazonaphthoquinone, the curing agent is an imidazole derivative, and the filler is silica.

6. The semiconductor package as claimed in claim 1, wherein the first organic insulating layer includes an imidazole derivative.

7. The semiconductor package as claimed in claim 1, wherein the first organic insulating layer surrounds the first chip conductive pad.

8. A semiconductor package comprising:

a first semiconductor chip including a first chip conductive pad disposed on an upper surface thereof;

at least one second semiconductor chip disposed on the first semiconductor chip, the at least one second semiconductor chip including a second chip conductive pad disposed on a lower surface thereof;

a solder ball connecting the first chip conductive pad to the second chip conductive pad;

a photosensitive insulating layer filling a space between the first semiconductor chip and the at least one second semiconductor chip;

a first organic insulating layer covering a side surface of the second chip conductive pad; and a second organic insulating layer covering a side surface of the first chip conductive pad.

9. The semiconductor package as claimed in claim 8, wherein the first organic insulating layer extends to cover a side surface of the solder ball.

10. The semiconductor package as claimed in claim 9, further comprising a second organic insulating layer covering a side surface of the first chip conductive pad and in contact with the first organic insulating layer.

11. The semiconductor package as claimed in claim 8, wherein the photosensitive insulating layer includes an epoxy resin, a dissolution inhibitor, a curing agent, and a filler.

12. The semiconductor package as claimed in claim 11, wherein the epoxy resin is a novolac resin, wherein:

the dissolution inhibitor is diazonaphthoquinone, the curing agent is an imidazole derivative, and the filler is silica.

13. The semiconductor package as claimed in claim 8, wherein the first organic insulating layer includes an imidazole derivative.

14. The semiconductor package as claimed in claim 8, wherein the first organic insulating layer surrounds the second chip conductive pad.

15. A semiconductor package comprising:

a first semiconductor chip including a first chip upper conductive pad disposed on an upper surface thereof;

a plurality of second semiconductor chips stacked on the first semiconductor chip, each of the second semiconductor chips including a second chip upper conductive pad disposed on an upper surface thereof and a second chip lower conductive pad disposed on a lower surface thereof;

a first solder ball connecting the second chip lower conductive pad of a lowermost one of the second semiconductor chips to the first chip upper conductive pad;

a second solder ball disposed between the second semiconductor chips;

a first photosensitive insulating layer filling a space between the lowermost one of the second semiconductor chips and the first semiconductor chip;

a second photosensitive insulating layer filling a space between the second semiconductor chips;

a first organic insulating layer covering a side surface of the first chip upper conductive pad;

a second organic insulating layer covering a side surface of the second chip lower conductive pad; and a third organic insulating layer covering a side surface of the second chip upper conductive pad.

16. The semiconductor package as claimed in claim 15, wherein the second organic insulating layer extends to cover a side surface of the first solder ball or the second solder ball.

17. The semiconductor package as claimed in claim 15, wherein each of the first and second photosensitive insulating layers includes an epoxy resin, a dissolution inhibitor, a curing agent, and a filler.

18. The semiconductor package as claimed in claim 17, wherein:

the epoxy resin is a novolac resin, the dissolution inhibitor is diazonaphthoquinone, the curing agent is an imidazole derivative, and the filler is silica.

* * * * *